(12) United States Patent
Takase et al.

(10) Patent No.: US 7,220,308 B2
(45) Date of Patent: May 22, 2007

(54) MANUFACTURING METHOD OF HIGH RESISTIVITY SILICON SINGLE CRYSTAL

(75) Inventors: Nobumitsu Takase, Tokyo (JP); Hideshi Nishikawa, Tokyo (JP); Makoto Ito, Tokyo (JP); Koujl Sueoka, Tokyo (JP); Shinsuke Sadamitsu, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 298 days.

(21) Appl. No.: 10/828,555

(22) Filed: Apr. 21, 2004

(65) Prior Publication Data

US 2005/0000410 A1 Jan. 6, 2005

(30) Foreign Application Priority Data

Apr. 21, 2003 (JP) .............................. 2003-115388

(51) Int. Cl.
*C30B 15/20* (2006.01)

(52) U.S. Cl. .............................. 117/13; 117/15; 117/18; 117/20; 117/30; 117/33

(58) Field of Classification Search .................. 117/13, 117/15, 20, 18, 30, 33
See application file for complete search history.

(56) References Cited

U.S. PATENT DOCUMENTS

| 5,067,989 | A | * | 11/1991 | Yokota et al. ............... 423/348 |
| 5,445,679 | A | * | 8/1995 | Hansen et al. ................. 134/1 |
| 6,454,851 | B1 | * | 9/2002 | Fuerhoff et al. .............. 117/15 |

* cited by examiner

*Primary Examiner*—Robert Kunemund
(74) *Attorney, Agent, or Firm*—Morrison and Foerster LLP

(57) ABSTRACT

To suppress a fluctuation in resistivity around a target value to thereby stably manufacture high resistivity silicon single crystals having almost the same resistivity values in a manufacturing method wherein a silicon raw material is molten to manufacture a high resistivity silicon single crystal in the range of from 100 to 2000 Ω cm with a CZ method. In a case where poly-silicon produced with a Siemens method using trichlorosilane as raw material is used as the silicon raw material, an impurity concentration in the silicon raw material is selected so as to be controlled in the range of from −5 to 50 ppta method in terms of (a donor concentration—an acceptor concentration) and the selected poly-silicon is used. In a case of a MCZ method, the poly-silicon is selected in the range of from −25 to 20 ppta and the selected poly-silicon is used. Instead of the raw material, poly-silicon produced with a Siemens method using monosilane as raw material is used. Alternatively, a silicon crystal manufactured with a CZ method or a MCZ method using poly-silicon raw material is used.

8 Claims, No Drawings

MANUFACTURING METHOD OF HIGH RESISTIVITY SILICON SINGLE CRYSTAL

BACKGROUND OF THE INVENTION

1. Field of the Invention

The present invention relates to a manufacturing method of a high resistivity silicon single crystal used in a substrate for a radio frequency communication device or the like.

2. Prior Art

In recent years, a demand for a high resistivity substrate has been built up in company with proliferation of a radio frequency communication device used in a short distance wireless LAN. A compound semiconductor technology using GaAs or the like has been conventionally used in more of cases on a substrate of a RF (Radio Frequency) circuit requiring a high resistivity. Such a compound semiconductor substrate, however, has been very expensive.

While a silicon CMOS was thought unsuitable for an RF circuit because of a high power consumption, it has become applicable to an RF circuit due to a great miniaturization and a progress in designing in recent years. Hence, attention has been focussed on a high resistivity silicon wafer excellent in an RF characteristic and economy, such as a mirror finished silicon wafer made from a high resistivity crystal grown with a Czochralski method (CZ method), an SOI (Silicon on Insulator) wafer or the like in place of a substrate made of a compound semiconductor such as GaAs.

A high resistivity silicon wafer can be obtained from a high resistivity silicon single crystal manufactured with a CZ method. In manufacture of a silicon single crystal with a CZ method, the silicon single crystal, as having been well known, is pulled up while being rotated from a silicon melt formed by melting a silicon raw material in a quartz crucible. The silicon raw material is in more of cases poly-silicon rods produced with a Siemens method using especially trichlorosilane as a raw material, which also applies to a case where a high resistivity silicon single crystal is produced without exception.

It has been found that in such a single crystal manufacturing method, however, high resistivity silicon single crystals, in a case where being produced, fluctuate in resistivity around a target value, which trend becomes more conspicuous with an increase in resistivity.

That is, a poly-silicon raw material used in manufacture of a single crystal with a CZ method has been recently of a sufficiently high purity, and while not only is a trace of a dopant added to the high class row material to thereby secure a predetermined resistivity, but a high quality crucible is used and a crucible rotational speed, a pressure in a pulling furnace and the like are also adjusted to thereby obtain a single crystal of a low oxygen concentration, a problem has arisen of a fluctuation in resistivity, which has not been encountered in manufacture of crystals of a common resistivity.

SUMMARY OF THE INVENTION

It is an object of the present invention to provide a manufacturing method of a high resistivity silicon single crystal at a high yield, capable of suppressing a fluctuation in resistivity around a target value to thereby stably manufacture high resistivity silicon single crystals having almost the same resistivity.

The present inventor has investigated and studied a cause for the fluctuation in resistivity of high resistivity silicon single crystals. As a result, it has been found that in manufacture of a high resistivity silicon single crystal, a fluctuation in impurity concentration in poly-silicon raw material, which has been regarded as not being problematic in manufacture of a silicon single crystal of a common resistivity, become a cause for a fluctuation in resistivity in the high resistivity silicon single crystal.

That is, in the recent field of manufacture of a silicon single crystal, high quality poly-silicon sufficiently low in impurity has been conventionally used regardless of a resistivity in order to raise a product quality and no special poly-silicon raw material has been used even in manufacture of a high resistivity silicon single crystal. Actually, even in manufacture of a high resistivity silicon single crystal, an impurity concentration in poly-silicon silicon raw material is sufficiently lower than a target resistivity value to thereby have secured a predetermined resistivity by reduction of a dopant amount added to a silicon single crystal.

In manufacture of a high resistivity silicon single crystal, however, a level of influence of an impurity concentration on a resistivity is enhanced with an increase in the resistivity and thereby, even a trivial difference in impurity concentration is resulted as a large fluctuation in resistivity. The present inventor focused attention on this trend and actually investigated a level of influence of an impurity concentration in poly-silicon raw material on a resistivity of a high resistivity silicon single crystal. As a result, the following facts have been found.

Poly-silicon raw material is packed in bags in use forms of cut rods, lumps or the like and supplied from a raw material maker to a single crystal maker. A raw material quality is usually indicated on each bag with a impurity concentration, a resistivity, a lifetime and the like, though there is a case where no raw material quality is indicated. No consideration has been given to the quality since the quality is as high as to sufficiently meet a requirement in resistivity even in a case of a high resistivity silicon single crystal. It has been found as a result of the investigation conducted by the present inventor that in fact, the quality affect the resistivity, however, to cause a fluctuation and it is required that in order to suppress the fluctuation in resistivity, poly-crystal raw material is selected to obtain a better quality with a high purity for actual use and to thereby, control poly-crystal raw material in actual use so as to have an impurity concentration a notch lower than the current level.

That is, poly-silicon raw material produced with a Siemens method using trichlorosilane as raw material is different in impurity concentration with a large fluctuation and relatively high or relative low in impurity concentration according to a production maker and in addition, according to a batch, a position in a furnace, a sampling position in the same rod or the like though being supplied from the same maker. By selecting a better product with a high purity for use from poly-silicon raw material, a fluctuation in resistivity in a case where high resistivity silicon crystals are manufactured can be alleviated.

While as a producing method of poly-silicon raw material, a Siemens method using trichlorosilane as raw material has been employed in more of cases in our country as described above, a producing method of poly-silicon raw material using monosilane as raw material has also been employed in foreign countries. The reason why trichlorosilane has been mainly used in our country is that the raw material is low in cost and good in crystallinity and operability, whereas monosilane low in reaction temperature is understood to be advantageous from the viewpoint of impurity contamination. In a matter of fact, poly-silicon raw material produced from monosilane as raw material is lower in impurity concentration as compared with one produced from trichlorosilnae as raw material. Accordingly, the use of poly-silicon raw material produced from monosilane is also effective for suppression of the fluctuation.

A silicon single crystal pulled up with a CZ method using poly-silicon raw material greatly decreases an impurity concentration therein as compared with that in poly-silicon raw material because of segregation. Therefore, the use of a silicon crystal pulled up with a CZ method using poly-silicon as silicon raw material in a CZ method is also effective for suppression of fluctuation in resistivity in high resistivity silicon single crystals. Note that the silicon crystal is not required to be of a single crystal.

A manufacturing method of a high resistivity single crystal of the present invention is a method having been developed based on the above findings and knowledge, wherein in a process where silicon raw material is molten to manufacture a high resistivity silicon single crystal having a resistivity in the range of from 100 to 2000 $\Omega$ cm with a CZ method or a MCZ method, an impurity concentration in the silicon raw material is controlled in the range of from −5 to 50 ppta in a case of the CZ method and in the range of from −25 to 20 ppta in a case of the MCZ method in terms of (a donor concentration—an acceptor concentration).

As silicon raw material, it is possible to use poly-silicon produced with a Siemens method using trichlorosilane as raw material, poly-silicon produced with a Siemens method using monosilane as raw material or silicon crystal manufactured by a CZ method or a MCZ method pulled up from poly-silicon raw material. In a case where silicon raw material is poly-silicon produced from trichlorosilane, the poly-silicon meeting the impurity concentrations is selectively used. In a case where silicon raw material is poly-silicon produced from monosilane or the silicon single crystal as raw material, no selection is required because of a low impurity concentration.

The reason why an impurity concentration range in silicon raw material is in the range of from −5 to 50 ppta in a case of a CZ method and in the range of from −25 to 20 ppta in a case of a MCZ method in terms of (a donor concentration—an acceptor concentration) is as follows.

According to an investigation conducted by the present inventor, it is required that in a case where a high resistivity silicon single crystal having a resistivity of 100 $\Omega$ cm or higher with a CZ method, an impurity concentration in silicon raw material is restricted to a value of the order in the range of 0±20 ppta in order to decrease a fluctuation in resistivity around a target value to a level of the order in the non-problematical range. Since in a CZ method, there occurs dissolution of B, Al and the like, which are acceptors (p), from a quartz crucible accommodating a raw material melt and a room corresponding to the dissolution can be available on the donor side (n), an impurity concentration in silicon raw material, in the case of the CZ method, is controlled in the range of from −5 to 50 ppta in terms of (a donor concentration—an acceptor concentration). In a case of a MCZ method, since almost no consideration is given to dissolution of B, Al and the like from a quartz crucible, an impurity concentration range in silicon raw material is in the range of from −25 to 20 ppta in terms of (a donor concentration—an acceptor concentration). A preferable impurity concentration is in the range of from 0 to 20 ppta in a case of the CZ method and in the range of from −5 to 10 ppta in a case of the MCZ, and in both cases of a CZ case and a MCZ case, an especially preferable impurity concentration is controlled commonly in the range of ±5 ppta in impurity concentration difference only in consideration of dissolution from a quartz crucible.

The reason why a resistivity of a high resistivity silicon single crystal product is limited to the range of from 100 to 2000 $\Omega$ cm is as follows. In a case of a resistivity less than 100 $\Omega$ cm, common raw material can be used. In a case where a resistivity exceeds 2000 $\Omega$ cm, there has been few requests for such a product and a fluctuation in measurement value of a resistivity are great, causing guarantee of a quality to be difficult and in addition, leading to difficulty controlling a crystal resistivity by doping. Note that a resistivity of silicon single crystal in the present invention means a resistivity in the top end portion of a single crystal cylindrical section.

DESCRIPTION OF THE PREFERRED EMBODIMENTS

Description will be given of embodiments of the present invention below.

In this embodiment, first of all, silicon raw material is put into a crucible. The silicon raw material is cut rods and/or lumps of poly-silicon produced with a Siemens method using trichlorosilane as raw material and a high purity product of raw material supplied to a single crystal manufacturer is selected so as to obtain a product especially having an impurity concentration in the range of from −5 to 50 ppta in terms of (a donor concentration—an acceptor concentration) and the selected raw material is used. A trace of a dopant is added to the selected silicon raw material so that a resistivity of a silicon single crystal to be manufactured satisfies a predetermined target value in the range of from 100 to 2000 $\Omega$ cm.

An impurity concentration in poly-silicon for CZ produced with the Siemens method using trichlorosilane as raw material, according to an investigation conducted by the present inventor, fluctuates greatly in the range of from −10 to 180 ppta in terms of (a donor concentration—an acceptor concentration). In this embodiment, a product having an impurity concentration in the range of from −5 to 50 ppta is selected from such poly-silicon and the selected poly-silicon is used.

The crucible into which the silicon raw material has been charged is placed in a chamber, the silicon raw material in the crucible is heat melted according to a predetermined procedure to form a raw material melt in the crucible. After the melt of raw material is formed, a silicon single crystal is pulled up from the raw material melt according to a predetermined procedure. The manufactured silicon single crystal is a high resistivity product falling in the range of from 100 to 2000 $\Omega$ cm in the top end portion of a cylindrical section and a fluctuation in resistivity are small because of the selective use of silicon raw material. In order to realize a low oxygen concentration, the following consideration is as described above given in pulling single crystal: the use of a high quality crucible, and adjustment in crucible rotational speed and pressure in a pulling furnace and the like.

Poly-silicon produced using monosilane can also be used instead of poly-silicon produced using trichlorosilane. Furthermore, a silicon single crystal manufactured with a CZ method from poly-silicon produced using trichlorosilane can also be used as silicon raw material. The kinds of raw silicon material can satisfy a requirement for an impurity concentration in the range of −5 to 50 ppta without selection.

EXAMPLES

Then, examples of the present invention are shown and an effect of the present invention will be made clear by comparison with comparative examples.

The following high resistivity silicon single crystals were manufactured with a CZ method using three kinds of poly-silicon produced from triclorosilane and supplied from different producers as raw material: p-type high resistivity silicon single crystal having resistivity values of 100 Ω cm, 300 Ω cm, 500 Ω cm, 1000 Ω cm and 2000 Ω cm, and n-type silicon single crystal having resistivity values of 100 Ω cm, 500 Ω cm and 2000 Ω cm. Analytical results of impurities included in the three kinds of poly-silicon are shown in Table 1.

TABLE 1 analytical results of impurities included in poly-silicon
(catalog values of ASIMI)

| measured elements | monosilane method | trichlorosilane method (FTIR/FTPL) | | |
|---|---|---|---|---|
| | | company A | company B | company C |
| B | 7 ± 1 | 8 ± 3 | 4 ± 1 | 9 ± 1 |
| P | 8 ± 2 | 31 ± 30 | 16 ± 9 | 27 ± 6 |
| As | — | — | 1 = 1 | trace |

(ppta)

The three kinds of poly-silicon were used in mixture without selection in a comparative example. In an example, a product in the range of from −5 to 50 ppta in terms of (a donor concentration—an acceptor concentration) is selected from the poly-silicons and the product was used. Actual resistivity values are shown in comparison with target resistivity values in Table 2 (p-type single crystal) and Table 3 (n-type single crystal).

TABLE 2 p-type resistivity after crystals are grown using raw material selected or not

| raw material selected or not | n: number | target resistivity (Ω cm) | | | | |
|---|---|---|---|---|---|---|
| | | 100 | 300 | 500 | 1000 | 2000 |
| No | 12 | 98.6 to 101 | 287 to 314 | 465 to 538 | 868 to 1200 | 1530 to 2910 |
| Yes | 10 | 99.8 | 302 | 491 to 508 | 992 to 1038 | 1910 to 2100 |

TABLE 3 n-type resistivity after crystals are grown using raw material selected or not

| raw material selected or not | n: number | target resistivity (Ω cm) | | |
|---|---|---|---|---|
| | | 100 | 500 | 2000 |
| No | 6 | 104 | 408 to 701 | 1030 to 3200 |
| Yes | 3 | 99.8 | 495 | 2090 |

It is understood from Tables 2 and 3 that by selecting raw material to control an impurity concentration in the raw material in the range of from −5 to 50 ppta in terms of (a donor concentration—an acceptor concentration), a deviation from a target resistivity is reduced. A deviation from a target resistivity in a case where raw material is selected comes from dissolution from a quartz crucible, inability of determining concentrations of Al and As at a measurement of an impurity concentration in raw material because of being less than measurable limits, a cooling state in donor annihilation heat treatment and the like. In a case where no selection is conducted, a deviation due to a difference in impurity concentrations in used raw material occurs in addition to the deviations caused by the above factors. In a case of a p-type resistivity of 100 Ω cm or higher, since a dopant concentration is $1.3 \times 10^{13}$ atoms/cm$^3$, a deviation of $1 \times 10^{12}$ atoms/cm$^3$, which corresponds to one tenth, or higher in a dopant concentration, if occurs, would greatly fluctuate a resistivity. Since a deviation in a dopant concentration in a case of no selection is conducted is about $2 \times 10^{12}$ atoms/cm$^3$ or higher, a fluctuation in resistivity unavoidably occurs, while since a deviation in a dopant concentration in a case of selection is conducted is restricted to about $5 \times 10^{11}$ atoms/cm$^3$, a fluctuation in resistivity is reduced even in a high resistivity.

The three kinds of poly-silicon produced from trichlorosilane were selected to thereby extract a product in the range of from −25 to 20 ppta in terms of (a donor concentration—an acceptor concentration) and the selected poly-silicon was used in a MCZ method. Actual resistivity values corresponding to target resistivity values are shown in Table 4 (p-type single crystal) and Table 5 (n-type single crystal).

TABLE 4 p-type resistivity after crystals are grown with MCZ method

| raw material selected or not | n: number | target resistivity (Ω cm) | |
|---|---|---|---|
| | | 500 | 1000 |
| No | 2 | 460 to 515 | 880 to 1300 |
| Yes | 3 | 490 to 505 | 990 to 1036 |

TABLE 5 n-type resistivity after crystals are grown with MCZ method

| raw material selected or not | n: number | target resistivity (Ω cm) | |
|---|---|---|---|
| | | 1000 | 2000 |
| No | 2 | 688 to 1910 | 1002 to 3100 |
| Yes | 2 | 890 to 1120 | 1600 to 2560 |

As can be seen from Tables 4 and 5, since dissolution of B, Al and the like from a quartz crucible decreases in a case of a MCZ method, raw material is selected so as to control an impurity concentration thereof in the range of from −25 to 20 ppta in terms of (a donor concentration—an acceptor concentration), thereby enabling a resistivity close to a target value to be obtained.

P-type and n-type high resistivity silicon single crystals having resistivity values of 500 Ω cm and 2000 Ω cm were produced with a CZ method from poly-silicon produced with a Siemens method using monosilane as raw material. Analytical results of impurity included in poly-silicon are shown in Table 1. A difference of (a donor concentration—an acceptor concentration) is in the range of from −2 to 4 ppta.

Actual resistivity values corresponding to target resistivity values of manufactured high resistivity silicon single crystals are shown in Table 6 (p-type single crystal) and Table 7 (n-type single crystal).

TABLE 6 p-type resistivity after crystals are grown using monosilane raw material

| | target resistivity (Ω cm) | |
|---|---|---|
| n: number | 500 | 1000 |
| 2 | 498 | 1010 |

TABLE 7 n-type resistivity after crystals are grown using monosilane

| | target resistivity (Ω cm) | |
|---|---|---|
| n: number | 500 | 2000 |
| 3 | 498 | 1999, 2015 |

As can be seen from Tables 6 and 7, poly-silicon raw material produced from monosilane is low in a P(phosphorus) concentration and again low in impurity concentration in terms of (a donor concentration—an acceptor concentration), thereby enabling a fluctuation in resistivity of high resistivity silicon single crystals to be decreased even without selection of raw material.

Twelve undoped silicon single crystals each weighing about 5 kg were grown from a total charge weight of 140 kg with a MCZ method using poly-silicon produced from trichlorosilane as raw silicon. The twelve ingots (totaled 60 kg) of thus purified raw material were cut and washed, then charged into a quartz crucible to grow p-type and n-type silicon single crystals of 6 inch in diameter and 1000 Ω cm in resistivity. Impurity concentrations in the purified raw material with the CZ method are shown in Table 8 and resistivities of the high resistivity silicon single crystal are shown in Table 9 (p-type single crystal) and Table 10 (n-type single crystal). A difference of (a donor concentration—an acceptor concentration) in the purified raw material is in the range of from −5 to 11 ppta.

TABLE 8 analytical results of impurities included in purified silicon crystal (PL)

| measured elements | contents |
|---|---|
| B | 5 ± 3 |
| P | 8 ± 5 |

(ppta)

TABLE 9 p-type resistivity after crystals are grown using purified raw material

| | target resistivity (Ω cm) |
|---|---|
| n: number | 1000 |
| 1 | 1020 |

TABLE 10 n-type resistivity after crystals are grown using purified raw material

| | target resistivity (Ω cm) |
|---|---|
| n: number | 1000 |
| 1 | 1050 |

As can be seen from Tables 8 to 10, a P (phosphorus) concentration in poly-silicon produced with a trichlorosilane method can be reduced with a CZ method or a MCZ method to purify the poly-silicon to a same level of poly-silicon produced with a monoslane method. A fluctuation in resistivity of high resistivity silicon single crystals grown using the purified raw material can also be decreased without conducting the selection. In this purifying method, an undoped crystal having a predetermined weight is grown and thereafter a dopant is added into the melt, thereby enabling manufacture of a single crystal product having a common resistivity. A dopant addition during growing a crystal allows the part which tends to be a nonstandarized product to be a raw material for a high resistivity.

As having described above, a manufacturing method of a high resistivity silicon single crystal of the present invention is a method wherein in a process where silicon raw material is molten to manufacture a high resistivity silicon single crystal having a resistivity in the range of from 100 to 2000 Ω cm with a CZ method or a MCZ method, an impurity concentration in the silicon raw material is controlled in the range of from −5 to 50 ppta in a case of the CZ method and in the range of from −25 to 20 ppta in a case of the MCZ method in terms of (a donor concentration—an acceptor concentration), whereby a fluctuation in resistivity around a target value is suppressed and high resistivity silicon single crystals having almost the same resistivity can be stably manufactured, leading to an effect of enabling great improvement on product yield.

What is claimed is:

1. A manufacturing method of a high resistivity silicon single crystal, wherein in a process where silicon raw material is molten to manufacture a high resistivity silicon single crystal having a resistivity in the range of from 100 to 2000 Ω cm with a CZ method, an impurity concentration in said silicon raw material is controlled in the range of from −5 to 50 ppta in terms of (a donor concentration—an acceptor concentration).

2. The manufacturing method of a high resistivity silicon single crystal according to claim 1, wherein said silicon raw material is poly-silicon produced with a Siemens method using trichlorosilane as a raw material, and said poly-silicon to fall within the control range of said impurity concentration is selectively used.

3. The manufacturing method of a high resistivity silicon single crystal according to claim 1, wherein said silicon raw material is poly-silicon produced with a Siemens method using monosilane as raw material.

4. The manufacturing method of a high resistivity silicon single crystal according to claim 1, wherein said silicon raw material is a silicon crystal manufactured with a CZ method or a MCZ method from poly-silicon raw material.

5. A manufacturing method of a high resistivity silicon single crystal, wherein in a process where silicon raw material is molten to manufacture a high resistivity silicon single crystal having a resistivity in the range of from 100 to 2000 Ω cm with a MCZ method, an impurity concentration in said silicon raw material is controlled in the range of from −25 to 20 ppta in terms of (a donor concentration—an acceptor concentration).

6. The manufacturing method of a high resistivity silicon single crystal according to claim 5, wherein said silicon raw material is poly-silicon produced with a Siemens method using trichlorosilane as a raw material, and said poly-silicon to fall within the control range of said impurity concentration is selectively used.

7. The manufacturing method of a high resistivity silicon single crystal according to claim 5, wherein said silicon raw material is poly-silicon produced with a Siemens method using monosilane as raw material.

8. The manufacturing method of a high resistivity silicon single crystal according to claim 5, wherein said silicon raw material is a silicon crystal manufactured with a CZ method or said MCZ method from poly-silicon raw material.

* * * * *